(12) United States Patent
Bathul et al.

(10) Patent No.: US 8,391,070 B2
(45) Date of Patent: Mar. 5, 2013

(54) MOVING PROGRAM VERIFY LEVEL FOR PROGRAMMING OF MEMORY

(75) Inventors: Fatima Bathul, Santa Clara, CA (US); Darlene Gay Hamilton, Husum, WA (US); Guy Hadas, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 665 days.

(21) Appl. No.: 12/326,388

(22) Filed: Dec. 2, 2008
(Under 37 CFR 1.47)

(65) Prior Publication Data
US 2010/0135082 A1 Jun. 3, 2010

(51) Int. Cl.
*G11C 11/34* (2006.01)
(52) U.S. Cl. .................................... 365/185.19
(58) Field of Classification Search ............... 365/185.19
See application file for complete search history.

(56) References Cited

U.S. PATENT DOCUMENTS

2008/0109697 A1* 5/2008 Ho et al. ....................... 714/755
2008/0266972 A1* 10/2008 Aritome .................... 365/185.19
2008/0316820 A1* 12/2008 Seol et al. ................. 365/185.03
2009/0034339 A1* 2/2009 Eguchi et al. ............. 365/185.22
2009/0316487 A1* 12/2009 Lee et al. .................. 365/185.22

* cited by examiner

*Primary Examiner* — Hoai V Ho
*Assistant Examiner* — Min Huang
(74) *Attorney, Agent, or Firm* — Turocy & Watson, LLP

(57) ABSTRACT

Systems, methods, and devices that employ moving program verify levels to facilitate programming data to memory elements in a memory component are presented. A program component can employs a specified number of program verify (PV) levels where a first program pulse is applied to a selected group of memory elements to facilitate verifying the cells to pass the first PV level. The PV level can be moved to a next PV level that is a higher charge level than or equal to the first PV level, and a subset of the group of cells that are below the next PV level are selected and a next program pulse is applied to the subset of cells to facilitate verifying the cells to pass the next PV level. The moving PV level process can continue until the group of memory elements is verified to pass the target PV level.

17 Claims, 9 Drawing Sheets

MOVING PROGRAM VERIFY LEVEL FOR PROGRAMMING OF MEMORY

TECHNICAL FIELD

The subject innovation relates generally to memory systems and in particular, to systems, methodologies, and devices that can facilitate adjusting program verify levels to facilitate efficient programming of memory.

BACKGROUND

A wide variety of memory devices can be used to maintain and store data and instructions for various computers and similar systems. In particular, flash memory is a type of electronic memory media that can be rewritten and retain content without consumption of power. Unlike dynamic random access memory (DRAM) devices and static random memory (SRAM) devices in which a single byte can be erased, flash memory devices are typically erased in fixed multi-bit blocks or sectors. Flash memory technology can include NOR flash and/or NAND flash, for example. NOR flash evolved from electrically erasable read only memory (EEPROM) chip technology, in which, unlike flash, a single byte can be erased; and NAND flash evolved from DRAM technology. Flash memory devices can be less expensive and denser as compared to many other memory devices, meaning that flash memory devices can store more data per unit area.

Flash memory has become popular, at least in part, because it combines the advantages of the high density and low cost of EPROM with the electrical erasability of EEPROM. Flash memory can be used in many portable electronic products, such as cellular phones, computers, voice recorders, thumbnail drives, and the like, as well as in many larger electronic systems, such as automobiles, airplanes, industrial control systems, etc. The fact that flash memory can be rewritten as well as its retention of data without a power source, small size and light weight have all combined to make flash memory devices a useful and popular means for transporting and maintaining data.

Nonvolatile memory (e.g., flash memory) typically comprises an array of nonvolatile memory elements wherein data (e.g. one or more bits of data) can be stored by programming desired voltage levels to selected memory elements, wherein each voltage level can correspond to a data state. Conventionally, when programming memory elements, a single program verify level is employed to facilitate programming memory elements to a desired data state. Programming of selected memory elements, or portions thereof (e.g. a memory element of a memory cell that contains multiple memory elements) can be performed by applying a number of programming pulses (e.g., voltage pulses) to the selected memory elements until the selected memory elements are programmed to the desired threshold charge level (e.g., corresponding to the program verify level) that corresponds to the desired data state. Typically, some memory elements can be programmed more quickly than other memory elements. As a result, using a single program verify level during programming can be inefficient as memory elements that can be programmed more quickly may receive voltage pulses with higher programming conditions like high programming drain voltage (Vd), gate voltage (Vg) and/or pulsewidth (pw) unnecessarily, which can result in potential overprogramming of the fast programming memory elements.

It is desirable to increase programming speed in memory devices. It is also desirable to tighten final distributions to facilitate improved reliability, density, and efficiency in memory devices.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The disclosed subject matter relates to systems, methods, and devices that can employ moving program verify levels to facilitate efficiently programming memory elements in a memory component (e.g., memory component comprising nonvolatile memory, such as flash memory). In an aspect, a memory component can comprise a program component that can facilitate moving (e.g., adjusting) program verify levels during programming of memory elements (e.g. memory element(s) in a memory cell) to facilitate efficiently programming selected memory elements in the memory component to a final (e.g., target) program verify level (e.g., target threshold voltage level). The memory elements (e.g., floating gate memory elements, dual element nitride storage flash memory elements, etc.) can be single bit memory elements or multi-bit or multi-level memory elements.

In one aspect, during programming, the program component can facilitate selecting a desired group of memory elements for programming to a specified data state (e.g., programming level). Typically, the selected memory elements can be in an unverified or intrinsic state prior to programming. The program component can facilitate setting a first program verify level and first set of program parameters, such as the drain voltage, gate voltage, and pulse width associated with the first pulse, based at least in part on predefined programming criteria, where the drain voltage and gate voltage can be the respective voltage levels applied to the drains and gates of the selected memory elements, and the pulse width can be the length of time the voltage pulse is applied to the memory elements. The first program verify level and first set of program parameters can be set such that all or a substantial portion (e.g., virtually all) of the selected memory elements will be verified to pass the first program verify level after the first program pulse. The first program pulse can be applied to the group of memory elements, and the program component can verify whether the memory elements have passed the first program verify level, where all or a substantial portion of the memory elements can be verified to pass the first program verify level.

After the first program pulse, the program component can adjust the program verify level to a second program verify level, which can be a higher level than the first program verify level, where the second program verify level can be selected such that all or a substantial portion of the selected memory elements will be verified to pass the second program verify level after the second program pulse is applied to those memory elements. The program component can evaluate the group of memory elements to determine whether any of the memory elements are already verified as passing the second program verify level. Typically, at least a portion of the group of memory elements can already be verified to pass the second program verify level before the second program pulse is applied. The program component can facilitate selecting a subset of the group of memory elements that are below the second program verify level, which may also include a subgroup of memory elements from the group of memory elements selected for first program verify, where the subgroup of memory elements did not pass for the first program verify level. The memory elements from the group that are already verified to pass the second program verify level do not receive the second program pulse. The program component can set the respective values of the second set of program parameters (e.g., drain voltage, gate voltage, pulse width) associated with the second program pulse based at least in part on predefined programming criteria. The program component can apply the second program pulse to the subset of the group of memory elements to facilitate passing the memory elements in the subset for the second program verify level.

If the second program verify level is not the target program verify level, which can correspond to the desired data state to which the memory cell is to be programmed, the program component can adjust the program verify level to the next program verify level, where the programming process can continue until the group of memory elements are verified to pass the target program verify level, based at least in part on predefined programming criteria. When a subset of memory elements is pulsed to program those cells to the target program verify level, there potentially can be some memory elements that are slower than other cells, and the slower memory elements may not reach the target program verify level with the expected last program pulse. In such instance, one or more program pulses, if desired, can be applied to any memory elements that do not reach the target program verify level after the expected last program pulse in order to verify and pass such memory elements.

In accordance with another aspect, the program verify levels, including the first program verify level, and program parameter values can be predefined values (e.g., at least initially), or can be values dynamically determined during the lifetime of the memory component to refine or fine tune the values in order to counter wear-related issues (e.g., erase cycles, read errors) on the memory component, based at least in part on the predefined programming criteria, to facilitate improving the usable life of the memory component. In yet another aspect, an optimizer component can facilitate evaluating memory elements, program verify levels, program parameters, and/or other information to facilitate dynamically refining the respective program verify levels, program parameters, and/or other parameters related to programming data to the memory component. Further, for each of the program pulses, the respective values of gate voltages, drain voltages, and/or pulse widths can be the same or different as the respective values for other program pulses.

In accordance with still another aspect, methods that can employ a moving program verify level to facilitate programming memory elements, or respective portions (e.g., memory elements) thereof, of a memory component are presented. In yet another aspect, an electronic device that can comprise a memory component that can employ a moving program verify level to facilitate programming memory elements, or respective portions (e.g., memory elements) thereof, of a memory component are presented.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and distinctive features of the disclosed subject matter will become apparent from the following detailed description of the innovation when considered in conjunction with the drawings.

DETAILED DESCRIPTION

Figure 1:
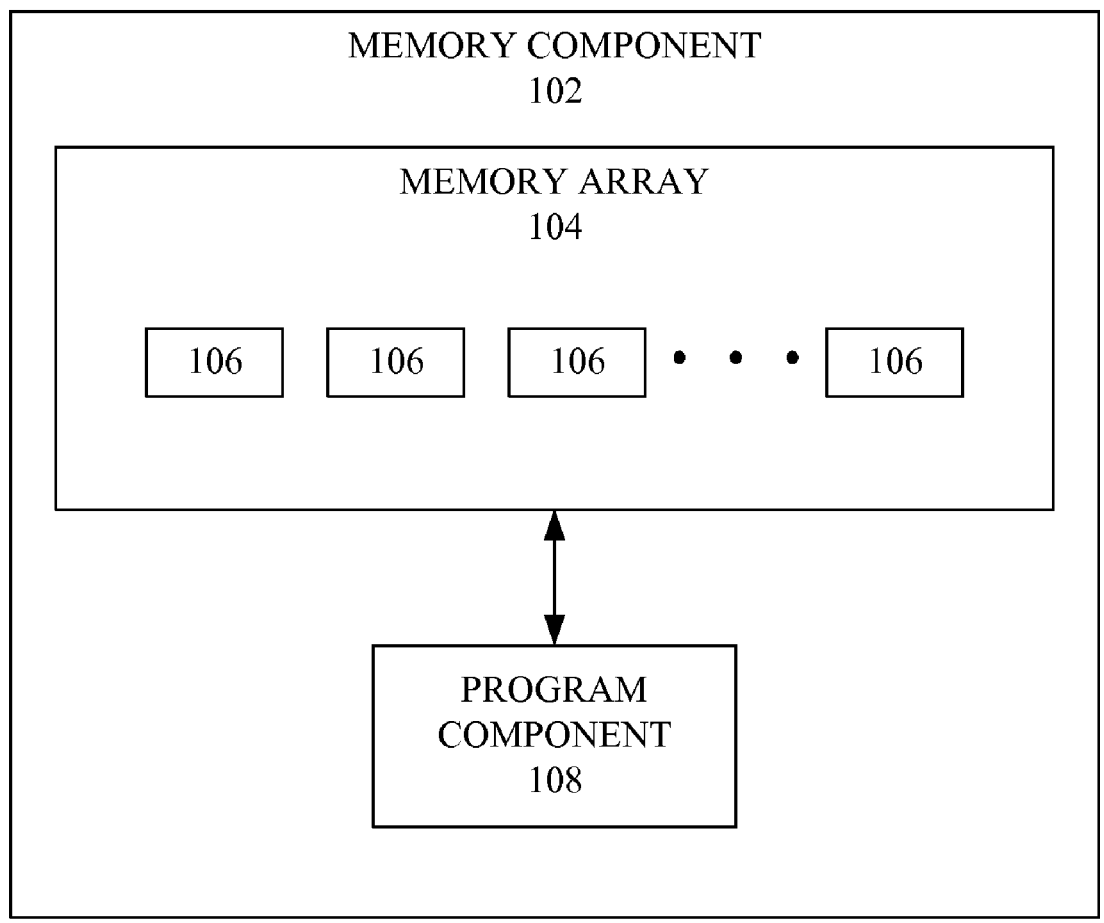
FIG. 1 illustrates an example block diagram of a system that can employ a moving program verify level to facilitate programming data into memory elements in a memory component in accordance with an aspect of the subject matter disclosed herein.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

Conventionally, when programming memory elements in a memory, a single program verify level is employed to facilitate programming memory elements to a desired data state. Programming of selected memory elements, or portions thereof (e.g., a memory element of a memory cell that contains multiple memory elements or single memory element) can be performed by applying a number of programming pulses (e.g., voltage pulses) to the selected memory elements until the selected memory elements are programmed to the desired threshold charge level (e.g., corresponding to the program verify level) that corresponds to the desired data state. Typically, during programming some memory elements can be programmed more quickly than other memory elements. As a result, using a single program verify level during programming can be inefficient as memory elements that can be programmed more quickly may receive voltage pulses with higher programming conditions like high programming drain voltage (Vd), gate voltage (Vg) and/or pulsewidth (pw) unnecessarily, which can result in potential over programming of the quicker or fast programming memory elements. It is desirable to increase programming speed in memory devices and tighten final distributions for memory elements to facilitate improved reliability, density, and efficiency in memory devices.

Systems, methods, and devices that employ moving program verify levels to facilitate programming data to memory elements (e.g. floating gate memory elements, dual element nitride storage flash memory elements) in a memory component are presented. In one aspect, a memory component can include a program component that can employ a specified number of program verify levels, for example, a desired number of intermediate program verify levels and a target (e.g., final) program verify level, that can be used to facilitate programming selected memory elements to a desired data state. The program component can select a group of memory elements for programming and can apply a first program pulse to the selected group of memory elements to facilitate verifying the cells to pass the first program verify level. The program component can adjust or move the program verify level to a next program verify level that is a higher charge level than the first program verify level. The program component can select a subset of the group of memory elements that are below the next program verify level and can apply a next program pulse (e.g., a pulse that is the same or different from the first program pulse, as desired) to the subset of memory elements to facilitate verifying the cells to pass the next program verify level. The program component can continue moving the program verify level to a next program verify level and applying a next program pulse to a subset of memory elements that are below the next program verify level until the target program verify level is reached and the group of memory elements is verified to pass the target program verify level, which can correspond to the desired data state.

FIG. 1 illustrates a system 100 that can employ moving program verify levels to facilitate programming memory elements in a memory component in accordance with an aspect of the subject matter disclosed herein. System 100 can include a memory component 102 that can be comprised of a memory array(s) 104 (e.g., nonvolatile memory array) that can store data, operation code, commands, etc., in individual memory elements 106 in the memory array 104. Each memory cell 106 can store one or more bits of data (e.g., multi-bit or multi-level memory cell). In an aspect, the memory elements 106 can be floating gate memory elements, dual element nitride storage flash memory cells, etc. In another aspect, the memory component 102 can comprise non-volatile memory (e.g., flash memory) and/or volatile memory (e.g., static random access memory (SRAM)), where the memory array(s) 104 can be non-volatile memory. It is to be appreciated and understood that, while one memory component 102 is depicted in system 100, the subject innovation is not so limited, as system 100 can include a plurality of memory components 102. Only one memory component 102 is depicted herein for brevity and clarity.

In accordance with an aspect, the memory component 102 can include a program component 108 that can facilitate moving (e.g. adjusting) program verify levels during programming of a group of memory elements 106 to facilitate efficiently programming the group of memory elements 106 to a desired target program verify level, which can correspond to a desired data state for the programmed data. By moving the program verify level from one level to another level between program pulse (e.g., voltage pulse used to facilitate programming a memory element to a desired data state), faster programming speeds can be achieved, as compared to conventional memory system, methods, and devices, and tighter final distributions can be obtained, which can result in a memory that has higher reliability (e.g. fewer read errors, longer useful life, . . . ), higher density (e.g., increased amount of data storage), improved efficiency, and a wider operating range, as compared to conventional memory systems, methods, or devices.

During programming, it can be desired to program a word of data, a page of data, or a desired number of bits or elements of data that can be grouped together. Programming the group of memory elements 106 associated with the word, page, or bits (e.g., elements) can be performed by applying multiple program pulses to the memory elements 106 to pulse the memory elements 106 to a target threshold voltage level (e.g., target program verify level) that can correspond with the desired data state for the programmed data. In one aspect, to facilitate programming, the program component 108 can facilitate selecting a desired group of memory elements for programming to a specified target program verify level that can correspond to a specified data state (e.g., programming level). Typically, the selected group of memory elements can be in an unverified or intrinsic state prior to programming. In another aspect, the program component 108 can facilitate setting a first program verify level and a first set of program parameters, such as the drain voltage, gate voltage, and pulse width associated with the first pulse, based at least in part on predefined programming criteria. The drain voltage and gate voltage can be the respective voltage levels applied to the drains and gates of the selected memory elements 106, and the pulse width can be the length of time the program pulse is applied to the selected memory elements 106. The first program verify level and first set of program parameters can be set to respective values such that all or a substantial portion (e.g. virtually all) of the selected memory elements 106 can be verified to pass the first program verify level after the first program pulse is applied to the selected memory elements 106. The program component 108 can facilitate applying the first program pulse to the group of memory elements 106 to raise the charge level in the memory elements 106 to at least the first program verify level. In an aspect, after the first pulse is applied, the program component 108 can evaluate the group of memory elements 106 to verify whether the memory elements 106 have passed the first program verify level (e.g., verify whether the memory elements 106 have a charge level that is at or above the first program verify level), where all or a substantial portion of the memory elements can be verified to pass the first program verify level.

In accordance with another aspect, after the first program pulse is applied, the program component 108 can adjust the program verify level to a second program verify level, which can be a higher level than the first program verify level. The second program verify level can be selected such that all or a substantial portion of the selected memory elements 106 will be verified to pass the second program verify level after the second program pulse is applied to those memory elements 106, including those memory elements 106, if any, which did not pass the first program verify level. The program component 108 can evaluate the group of memory elements 106 to determine whether any of the memory elements 106 are already verified as passing the second program verify level (e.g., determine whether any memory elements 106 have a charge level that is at or above the second program verify level). Typically, at least a portion of the group of memory elements 106 already can be verified to pass the second program verify level before the second program pulse is applied. In an aspect, the program component 108 can facilitate selecting a subset of the group of memory elements 106 that are below the second program verify level. The portion of the memory elements 106 from the group that already are verified to pass the second program verify level do not receive the second program pulse. The program component 108 can set the respective values of the second set of program parameters (e.g., drain voltage, gate voltage, pulse width) associated with the second program pulse based at least in part on predefined programming criteria. The program component 108 can apply the second program pulse to the subset of the group of memory elements 106 to facilitate passing the memory elements 106 in the subset for the second program verify level, so that all or a substantial portion of the group of memory elements 106 can be verified to pass for the second program verify level.

If the second program verify level is not the target program verify level, the program component 108 can continue to adjust the program verify level to a next program verify level and set the respective program parameters for a program pulse associated with a particular program verify level, based at least in part on predefined programming criteria, until the group of memory elements 106 are programmed to the target program verify level.

Figure 2:
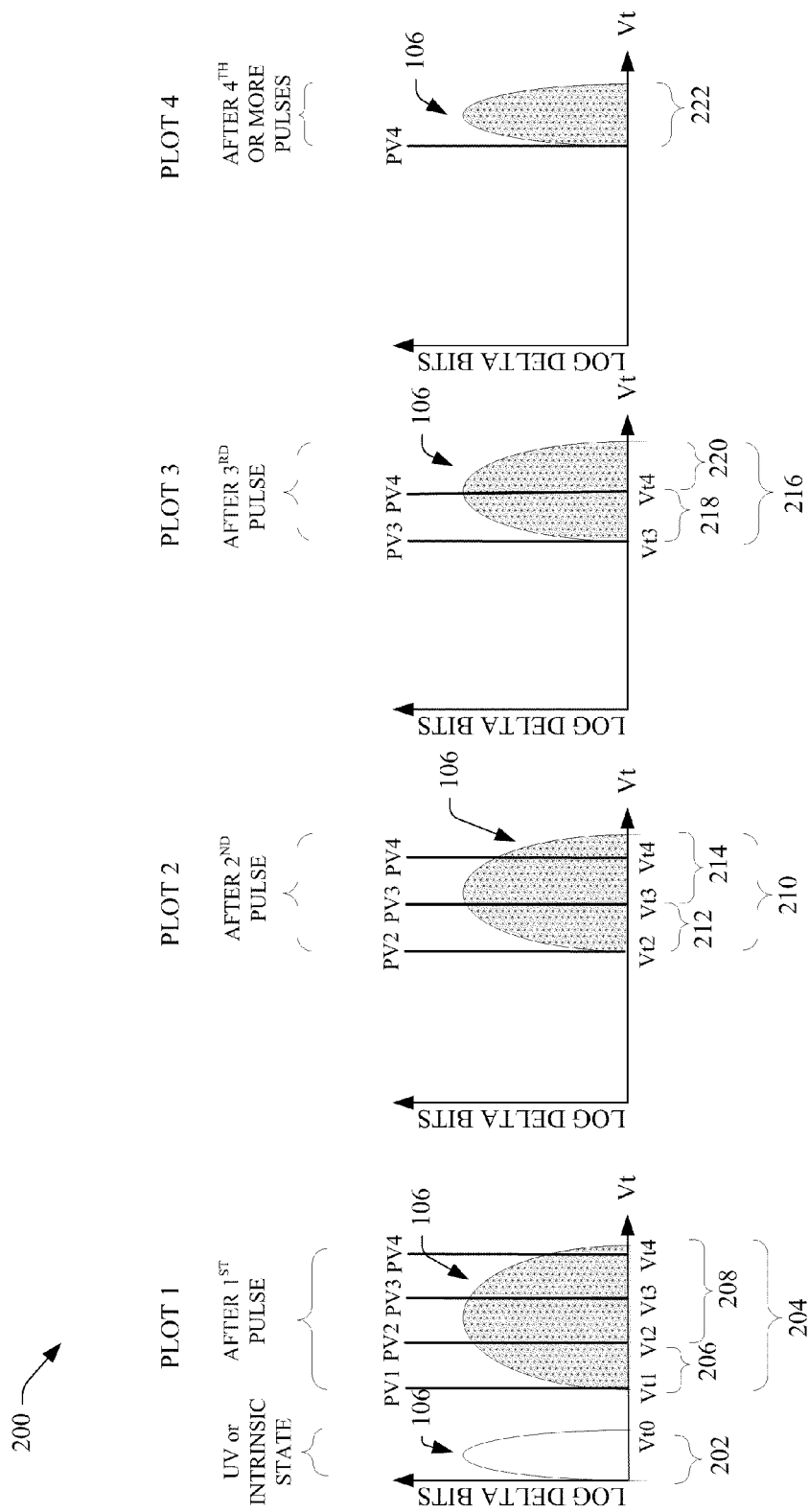
FIG. 2 illustrates an example plot relating to employing moving program verify levels to facilitate programming data to desired memory elements in a memory component in accordance with an aspect of the disclosed subject matter.

Referring briefly to FIG. 2, illustrated is an example plot 200 relating to employing moving program verify levels to facilitate programming data to desired memory elements in a memory component in accordance with an aspect of the disclosed subject matter. For example, as depicted in FIG. 2, four program verify levels can be employed, where the fourth program verify level is the target program verify level. The program component 108 can select a group of memory elements 106 that can initially be in an unverified or intrinsic state, as depicted at 202. The program component 108 can set a first program verify level (PV1) and can set the program parameters to desired values for the first program pulse. The program component 108 can apply the first program pulse to the group of memory elements 106 so that all or a substantial portion of the memory elements 106 are verified to pass the first program verify level, as illustrated at 204. The program component 108 can adjust the program verify level to the second program verify level (PV2) and can set the program parameters to desired values for the second program pulse. A subset of the group of memory elements 106 that are below the second program verify level can be selected, as depicted at 206, where the subset of the group of memory elements 106 can receive a second program pulse so that all or a substantial portion of the group of memory elements 106 can be verified to pass the second program verify level, as depicted at 210. Since the remaining portion of the group of memory elements 106 already are verified to pass the second program verify level, this portion of memory elements 106 does not receive the second program pulse, as illustrated at 208.

The program component 108 can adjust the program verify level to the third program verify level (PV3), which can be a higher voltage level than the second program verify level, and can set the program parameters to desired values for the third program pulse. The program component 108 can evaluate the group of memory elements 106 to determine which memory elements 106 are below the third program verify level. The program component 108 can select a subset of the group of memory elements 106 that are below the third program verify level, as depicted at 212, where memory elements 106 in this subset can be pulsed with the third program pulse to facilitate increasing the charge level in those cells 106 and verifying those cells 106 for pass to the third program verify level. The portion of the group of memory elements 106 that are at or above the third program verify level already can be verified to pass for the third program verify level, as illustrated at 214, and do not receive the third program pulse. The program component 108 can facilitate applying the third pulse to the memory elements 106 in the subset. At this point, all or substantially all of the memory elements 106 in the group can be verified to pass for the third program verify level, as illustrated at 216.

The program component 108 can adjust the program verify level to the fourth program verify level (PV4), which can be the target program verify level, and can set the program parameter values to respective values associated with the fourth program pulse, based at least in part on predefined programming criteria. The program component 108 can evaluate the group of memory elements 106 to determine which memory elements 106 already are passed to verify for the target program verify level. The program component 108 can select a subset of memory elements 106 that is below the target program verify level for further programming, as depicted at 218. The portion of memory elements 106 that is at or above the target program verify level already can be passed to verify for the target program verify level and this portion of memory elements 106 is programmed to the desired data state with no further programming required, as illustrated at 220. The program component 108 can apply the fourth program pulse to the memory elements 106 in the subset to facilitate raising their respective charge levels to the target program verify level, as illustrated at 222. After applying the fourth program pulse, the program component 108 can evaluate the memory elements 106 (e.g., the memory elements in the subset) to determine whether the cells 106 are at or above the target program verify level. If any of the memory elements 106 is below the target program verify level, the program component 108 can select such elements 106 for further pulsing, where one or more desired program pulses can be applied to those elements 106 in order to increase their respective charge levels to at or above the target program verify level.

It is to be appreciated and understood that, while the above example programming relates to four program verify levels, the subject innovation is not so limited, as there can be less than four program verify levels, four program verify levels, or more than four programming verify levels, that can be employed to facilitate programming data to memory elements 106 in the memory component 102, in accordance with the subject innovation. It is to be further appreciated and understood that in the subject disclosure, often there is reference to programming memory elements 106, however, programming of memory elements 106 is also intended to encompass programming of a memory element of a memory cell 106, as a memory cell 106 can comprise one or more memory elements that each can store one or more bits of data.

Referring again to FIG. 1, in accordance with yet another aspect, the program verify levels, including the first program verify level, and program parameter values can be predefined values (e.g., at least initially), which can be selected based at least in part on predefined programming criteria to facilitate desired (e.g., optimal) performance of the memory component 102. For example, in accordance with the predefined programming criteria, programming speed, type of memory, the number of program verify levels to employ for programming, the desired data state to which selected memory elements 106 are to be programmed, the particular target program verify level corresponding to the desired data state, density of the memory, and/or other factors can be evaluated in determining respective program verify levels and respective program parameter values. In an aspect, for each of the program pulses, the respective values of gate voltages, drain voltages, and/or pulse widths can be the same or different as the respective values for other program pulses.

In still another aspect, the memory component 102 can facilitate optimizing performance of the memory component 102 by dynamically refining or fine tuning the setting of program verify levels and/or program parameter values, and/ or the number of program pulses applied during a programming event. The memory component 102 can evaluate the performance of the memory component 102, for example, during programming operations or on a periodic basis to facilitate determining whether any settings are to be refined, and the memory component 102 can refine a specified setting(s) in accordance with the predefined programming criteria. The memory component 102 can facilitate evaluating memory elements, program verify levels, program parameters, and/or other information to facilitate dynamically refining the respective program verify levels, program parameters, and/or other parameters related to programming data to the memory component 102. For example, the memory component 102 can evaluate the number of program and erase cycles (e.g., overall number of cycles for the memory array 104) and/or number of read errors (e.g. overall number of read errors for the memory array 104) associated with memory elements 106 to facilitate determining whether to refine a particular program setting. Refining the program setting values associated with programming can facilitate increasing the useful life and improve performance of the memory component 102.

Referring again to the memory component 102, the nonvolatile memory can include, but is not limited to, flash memory (e.g., single-bit flash memory, multi-bit flash memory), read-only memory (ROM), mask-programmed ROM, programmable ROM (PROM), Erasable PROM (EPROM), Ultra Violet (UV)-erase EPROM, one-time programmable ROM, electrically erasable PROM (EEPROM), and/or nonvolatile RAM (e.g., ferroelectric RAM (FeRAM)). A flash memory can be comprised of NAND memory and/or NOR memory, for example. Volatile memory can include, but is not limited to, random access memory (RAM), static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Figure 3:
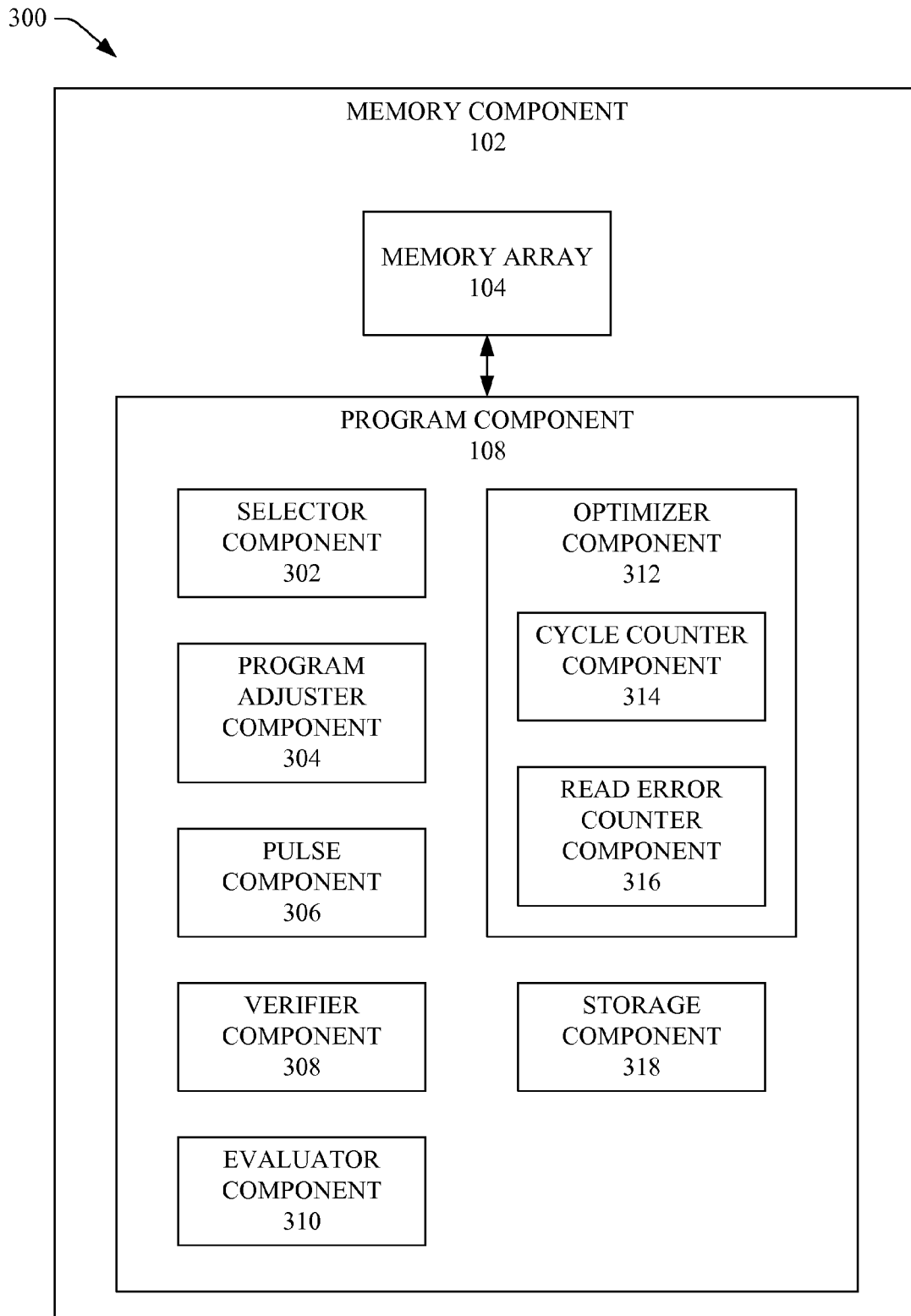
FIG. 3 is a block diagram depicting a system that can facilitate employing moving program verify levels to efficiently program data in memory elements in a memory in accordance with an aspect of the disclosed subject matter.

Turning to FIG. 3, illustrated is a block diagram of a system 300 that can facilitate employing moving program verify levels to efficiently program data in memory elements in a memory in accordance with an aspect of the disclosed subject matter. System 300 can comprise a memory component 102 that can be utilized to store data. The memory component 102 can include a memory array 104 that can contain a plurality of memory elements 106 (not shown in FIG. 3), where each memory cell 106 can store one or more bits of data. The memory component 102 can further contain a program component 108 that can facilitate adjusting program verify levels during programming of data to memory elements 106 to facilitate efficient programming data to the memory component 102 based at least in part on predetermined programming criteria. The memory component 102, memory array 104, memory elements 106, and program component 108 each can be the same or similar as, and/or can comprise the same or similar respective functionality as, respective components, such as more fully described herein, for example, with regard to system 100.

In accordance with an aspect, the program component 108 can include a selector component 302 that can facilitate selecting a desired group of memory elements 106 for programming during a programming event. The group of cells 106 can facilitate programming a word of data, a page of data, or another group of memory elements. In another aspect, after a program pulse is provided to the group of memory elements, or a portion thereof, and the program verify level has been changed (or remains the same program verify level or remains the same when it is the target program verify level, as desired), the selector component 302 can facilitate selecting a subset of memory elements 106 in the group of memory elements 106, where the subset of memory elements 106 can include memory elements 106 that are below the applicable program verify level, where the subset of memory elements 106 can be further programmed (e.g., can have a program pulse applied thereto) to facilitate increasing the charge level of the memory elements 106 in the subset so that those memory elements 106 can be verified to pass the specified program verify level.

In another aspect, the program component 108 can contain a program adjuster component 304 that can facilitate setting respective program parameter values (e.g., drain voltage level, gate voltage level, pulse width) and respective program verify levels during a programming event for a selected group of memory elements 106, or selected subset thereof, in the memory component 102. The program adjuster component 304 can facilitate setting a drain voltage level and gate voltage level to be applied to the respective drains and gates of each selected memory element 106 as well as pulse width of the program pulse for a particular program pulse event during a programming event. The respective program parameter values can be set such that the program pulse can facilitate increasing the charge level of the selected memory elements 106 so that the selected memory elements 106 can be verified to pass the particular program verify level associated with the particular pulse event. In another aspect, the program adjuster component 304 can facilitate adjusting a program verify level to the next program verify level, which can be at a higher voltage level than the previous program verify level (or the next program verify level can remain unadjusted and can be the same voltage level as the previous program verify level, as desired), prior to the next program pulse event to facilitate progressively and efficiently programming the selected memory elements 106. The program parameter values and program verify levels can be determined based at least in part on predefined programming criteria.

In another aspect, the program component 108 also can include a pulse component 306 that can facilitate applying a desired number of program pulses, which can have respective voltage levels and respective pulse widths, to memory elements 106 selected for programming during a programming event. In still another aspect, the program component 108 can comprise a verifier component 308 that can work in conjunction with an evaluator component 310 to facilitate determining whether selected memory elements 106 are verified to pass a particular program verify level after a program pulse and/or, after the program adjuster component 304 adjusts the program verify level to the next program verify level, can determine which memory elements 106 are at or above the next program verify level (e.g., are verified to pass the next program verify level) and which memory elements 106 are below the next program verify level to facilitate determining which memory elements 106 are to be pulsed during the next program pulse.

In still another aspect, the program component 108 can comprise an optimizer component 312 that can facilitate refining and/or fine tuning programming operations (e.g., moving reference programming operations) of the memory component 102. The optimizer component 312 can operate in conjunction with the evaluator component 310 to evaluate the efficiency of programming operations (e.g. programming speed, power consumption, etc.) and can dynamically refine (e.g., adjust) program parameters and/or program verify levels based at least in part on predefined programming criteria. For example, the optimizer component 312 can analyze the number of cycles (e.g. erase cycles) and/or the number of read errors associated with the memory elements 106 and can refine program parameters and/or program verify levels based at least in part on the number of cycles or number of read errors. The optimizer component 312 can comprise a cycle counter component 314 that can track and maintain a count related to cycles of the respective memory elements 106, and an error counter component 316 that can track and maintain a count related to the number of read errors for respective memory elements 106. For example, as the number of cycles increases for the memory elements 106 (e.g. overall number of cycles for all memory elements 106), which can occur as the memory component 102 ages, the optimizer component 312 can determine that the program parameters and/or program verify levels (e.g., multiple program verify levels during moving reference programming) are to be adjusted based at least in part on the predefined programming criteria. As another example, the optimizer component 312 can analyze charge levels of respective memory elements 106 after programming and can determine that a portion of the memory elements 106 are being overprogrammed using the current program parameters, and the optimizer component 312 can facilitate adjusting the program parameters to reduce overprogramming of memory elements 106.

In yet another aspect, the program component 108 can contain a storage component 318 that can store data, code, commands, etc., related to programming data to memory elements 106 using moving program verify levels. For example, the storage component 318 can comprise volatile memory, such as RAM, SRAM, DRAM, SDRAM, DDR SDRAM, ESDRAM, SLDRAM, RDRAM, DRDRAM, and/or RDRAM. It is to be appreciated and understood that the selector component 302, pulse adjuster component 304, pulse component 306, verifier component 308, evaluator component 310, optimizer component 312, cycle counter component 314, error counter component 316, and storage component 318 each can be a stand-alone unit, can be included within the program component 108 (as depicted), can be incorporated within another component, and/or virtually any suitable combination thereof, as desired.

Figure 4:
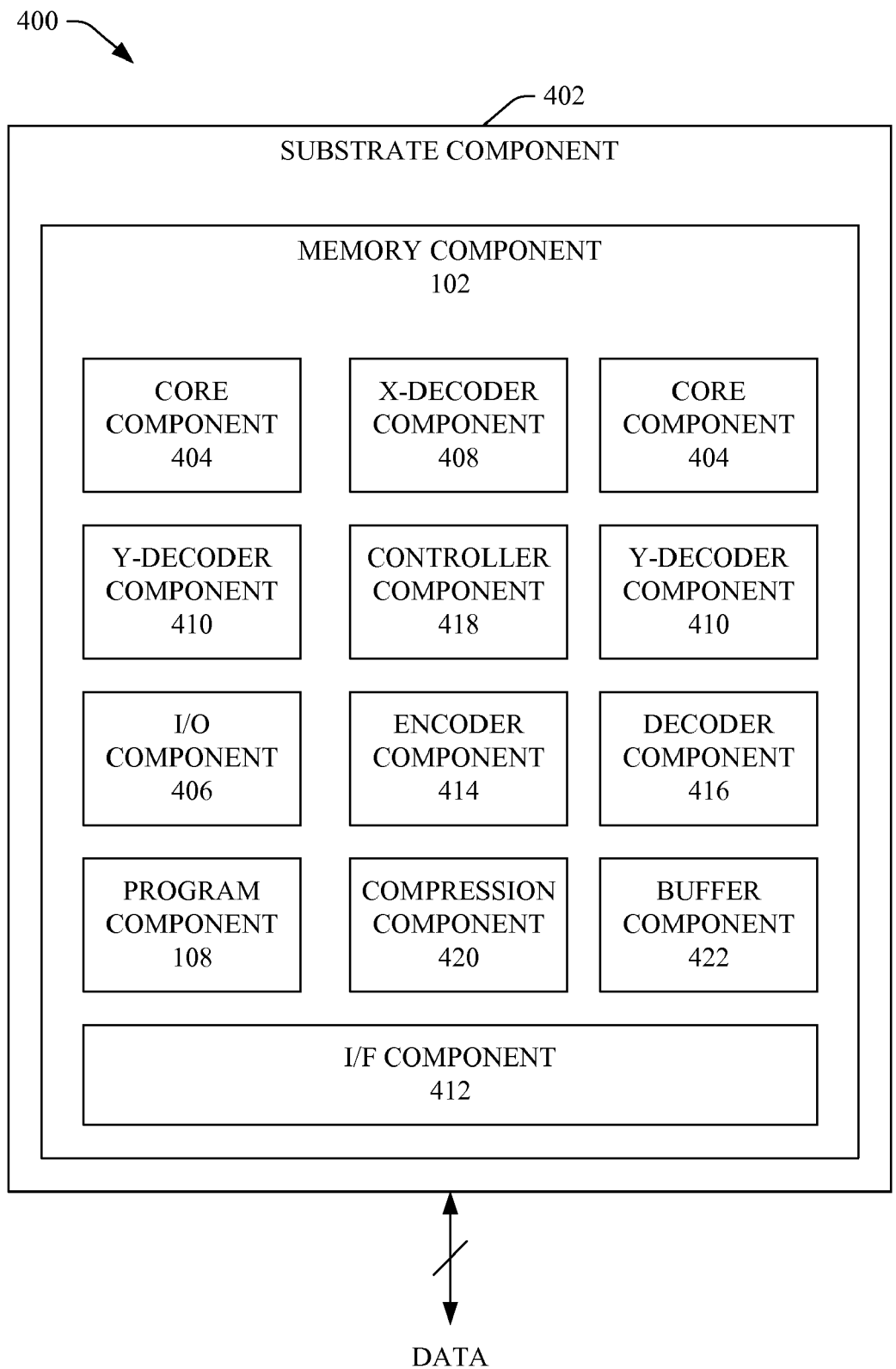
FIG. 4 illustrates a block diagram of a memory device that can utilize moving program verify levels to facilitate programming data to memory elements in the memory device in accordance with an aspect of the disclosed subject matter.

Turning to FIG. 4, depicted is a diagram of a memory device 400 that can utilize moving program verify levels to facilitate programming data to memory elements in the memory device in accordance with an aspect of the disclosed subject matter. Memory device 400 can comprise a memory component 102 that can comprise a non-volatile memory (e.g. flash memory) and/or volatile memory (e.g. SRAM). The memory component 102 can receive information, including data, commands, and/or other information, which the memory component 102 can process (e.g., store data, execute commands, etc.). The memory component 102 can include a memory array(s) 104 (e.g., as illustrated in FIG. 1 and described herein) that can comprise a plurality of memory elements (e.g., 106) (not shown in FIG. 4) in which data can be stored. The memory component 102 can also comprise a program component 108 that can employ moving program reference values (e.g., moving program verify values) facilitate efficient programming of memory elements 106 in the memory array 104 of the memory component 102 based at least in part on predefined programming criteria. The memory component 102, memory array 104, memory elements 106, and program component 108, each can be the same or similar as, and/or each can contain the same or similar functionality as, respective components more fully described herein, for example, with regard to system 100 and system 300.

In one aspect, the memory component 102, including the memory array 104 and program component 108, and other components described herein, for example, with regard to memory device 400 can be formed and/or contained on a substrate 402 (e.g., semiconductor substrate). In another aspect, one or more core components 404 (e.g. high-density core regions) and one or more lower-density peripheral regions can be formed on the substrate 402. The core component(s) 404 typically can include one or more M by N arrays (e.g., memory array 104) of individually addressable, substantially identical multi-bit memory elements (e.g. 106) (not shown in FIG. 4).

The lower-density peripheral regions can typically include an input/output component 406 (e.g., input/output (I/O) circuitry) and programming circuitry for selectively addressing the individual memory elements. The programming circuitry can be represented in part by and can include one or more x-decoder components 408 and one or more y-decoder components 410 that can cooperate with the I/O component 406 for selectively connecting a source (not shown), gate (not shown), and/or drain (not shown) of selected addressed memory elements to predetermined voltages or impedances to effect designated operations (e.g., programming, reading, verifying, erasing) on the respective memory elements, and deriving necessary voltages to effect such operations. For example, an x-decoder component 408 and a y-decoder component 410 can each receive address bus information, which can be provided as part of a command, and such information can be utilized to facilitate determining the desired memory cell(s) in the memory component 102.

Figure 5:
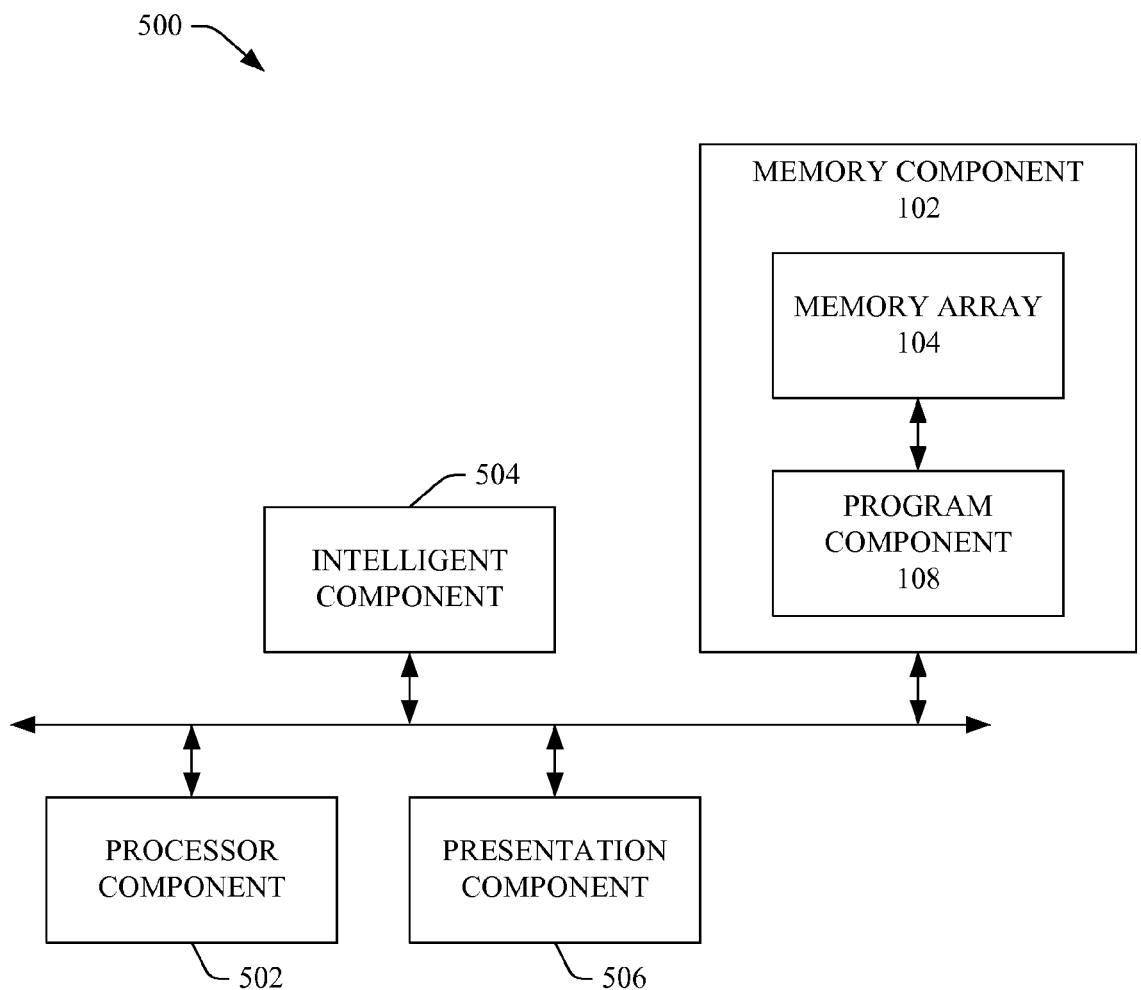
FIG. 5 a block diagram of a system that can employ intelligence to facilitate programming data into a memory component using moving program reference values in accordance with an embodiment of the disclosed subject matter.

The memory component 102 can receive information (e.g., data, commands, etc.) via an interface component 412 (also referred to herein as "I/F 412"), which can also be formed on substrate 402. I/F 412 can include and/or provide various adapters, connectors, channels, communication paths, etc. to integrate the memory component 102 into virtually any operating and/or database system(s) and/or with one another system(s). In addition, I/F 412 can provide various adapters, connectors, channels, communication paths, etc., that can provide for interaction and/or communication with a processor component (e.g., as depicted in FIG. 5 and described herein), and/or any other component, data, and the like, associated with the memory device 400.

The memory component 102 can also contain an encoder component 414 that can facilitate encoding data being programmed to the memory component 102, where the encoder component 414 also can be formed on the substrate 402. For example, the encoder component 414 can facilitate converting a digital signal to an analog signal (e.g., current level) to facilitate programming data in the storage locations (e.g., memory elements) in the memory component 102.

The memory component 102 can further include a decoder component 416 that can facilitate decoding data being read from the memory component 102. The decoder component 416 can receive an analog signal associated with data, where the analog signal can be stored in the storage location in the memory array 104, and can facilitate converting the analog signal to a digital signal, so that such digital signal representing the read data can be provided to another component (e.g. processor component) for further processing.

The memory component 102 also can comprise a controller component 418, which can be formed on substrate 402. The controller component 418 can facilitate control of the flow of data to and from the memory component 102. In an aspect, the controller component 418 can facilitate execution of operations (e.g., read, write, verify, erase) associated with memory elements 106 in the memory array 104 based at least in part on received commands. In another aspect, the controller component 418 can operate in conjunction with the program component 108 to facilitate adjusting program verify levels and/or setting program parameter values during a programming event to facilitate efficiently programming data in desired memory elements 106 in the memory array 104.

Memory component 102 can further include a compression component 420 that can be formed on substrate 402 and can be used to facilitate the compression and decompression of data and/or code to be stored in the memory array 104, to facilitate reducing and/or minimizing the consumption of the available memory in the memory array 104. For example, in response to a request by a host processor (e.g., processor component 502, as illustrated in FIG. 5 and described herein) to read data (e.g., MP3 file) from the memory component 102, the requested data can be retrieved from the memory array 104, with the compression component 420 being used to facilitate the de-compression of the data being read from the memory array 104. The de-compressed data can be provided by the memory component 102 to the host processor. In another aspect, the compression component 420 can be used to compress data being received from a host processor for storage in the memory array 104, with the compression component 420 compressing the data before storing the data in a specified location in the memory array 104. Common forms of data compression include algorithms based upon the Lempel-Ziv (LZ) compression method including LZ-Welch, LZ-Renau, and Huffman. Data compression techniques can be "lossy" or "lossless", where "lossy" compression can involve the loss of information between the source code and the compressed code and can be an acceptable effect in such applications as image and sound files, and "lossless" compression schemes can be reversible, allowing the original data to be fully reconstructed. Choice between the use of "lossy" vs. "lossless" compression can depend in part upon the application and file type to be compressed.

In one aspect, the memory component 102 can include a buffer component 422 that can be formed on substrate 402 and can facilitate storing data (e.g., temporarily storing data), such as, for example, data being programmed to or read from the memory array 104. The buffer component 422 can comprise volatile memory, such as RAM, SRAM, DRAM, SDRAM, DDR SDRAM, ESDRAM, SLDRAM, RDRAM, DRDRAM, and/or RDRAM, for example.

In another aspect, memory device 400 can also include a bus (not shown) that can be comprised of any of several types of bus structure(s) including, but not limited to, a memory bus, memory controller, peripheral bus, external bus, and/or a local bus using any variety of available bus architectures including, but not limited to, Open NAND Flash Interface, Compact Flash Interface, Multimedia Card (MMC), Secure Digital (SD), CE-ATA, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

Referring to FIG. 5, depicted is a block diagram of a system 500 that can employ intelligence to facilitate programming data into a memory component using moving program reference values in accordance with an embodiment of the disclosed subject matter. System 500 can include a memory component 102 that can be comprised of a non-volatile memory (e.g., multi-bit flash memory) and/or volatile memory (e.g., SRAM). The memory component 102 can include a memory array 104 that can be comprised of a plurality of memory elements 106 (not shown), where, for each memory cell 106, one or more bits of data can be stored (e.g., memory cell can comprise one or more memory elements, wherein each memory element can store one or more bits of data), and from which stored data can be read. The memory component 102 also can include a program component 108 that can utilize moving program verify levels during programming of selected memory elements 106 to facilitate programming data in the memory array 104 based at least in part on predefined programming criteria. It is to be appreciated that the memory component 102, memory array 104, memory elements 106, and program component 108 each can be the same or similar as respective components, and/or can contain the same or similar functionality as respective components, as more fully described herein, for example, with regard to system 100, memory device 300, and system 400.

The system 500 can further include a processor component 502 that can be associated with the memory component 102 and other components via a bus. In accordance with an embodiment of the disclosed subject matter, the processor component 502 can be a typical applications processor that can manage communications and run applications. For example, the processor component 502 can be a processor that can be utilized by a computer, mobile handset, personal data assistant (PDA), or other electronic device. The processor component 502 can generate commands, including read, write, and/or erase commands, in order to facilitate reading data from, writing data to, and/or erasing data from the memory component 102

The system 500 also can include an intelligent component 504 that can be associated with the memory component 102, the processor component 502, and/or other components associated with system 500 to facilitate analyzing data, such as current and/or historical information, and, based at least in part on such information, can make an inference(s) and/or a determination(s) regarding, for example, whether a program verify level(s) and/or program parameter(s) are to be adjusted, the number of program verify levels to be employed with regard to programming data to a desired state, etc.

For example, based in part on current and/or historical evidence, the intelligent component 504 can infer that one of the program verify levels utilized to program selected memory elements 106 to a desired data state should be modified to facilitate improved programming speed. The intelligent component 504 can communicate information related to the inferences and/or determinations to the program component 108. Based at least in part on the inference with respect to such data by the intelligent component 504, the program component 108 can facilitate adjusting that program verify level to facilitate improved programming speed.

It is to be understood that the intelligent component 504 can provide for reasoning about or infer states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data (e.g., historical data), whether or not the events are correlated in close temporal proximity, and whether the events and data come from one or several event and data sources. Various classification (explicitly and/or implicitly trained) schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

A classifier is a function that maps an input attribute vector, x=(x1, x2, x3, x4, xn), to a confidence that the input belongs to a class, that is, f(x)=confidence(class). Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, which hypersurface attempts to split the triggering criteria from the non-triggering events. Intuitively, this makes the classification correct for testing data that is near, but not identical to training data. Other directed and undirected model classification approaches include, e.g., naive Bayes, Bayesian networks, decision trees, neural networks, fuzzy logic models, and probabilistic classification models providing different patterns of independence can be employed. Classification as used herein also is inclusive of statistical regression that is utilized to develop models of priority.

System 500 also can include a presentation component 506, which can be connected with the processor component 502. The presentation component 506 that provides various types of user interfaces to facilitate interaction between a user and any component coupled to the processor component 502. As depicted, the presentation component 506 is a separate entity that can be utilized with the processor component 502 and associated components. However, it is to be appreciated that the presentation component 506 and/or similar view components can be incorporated into the processor component 502 and/or a stand-alone unit. The presentation component 506 can provide one or more graphical user interfaces (GUIs), command line interfaces, and the like. For example, a GUI can be rendered that provides a user with a region or means to load, import, read, etc., data, and can include a region to present the results of such. These regions can comprise known text and/or graphic regions comprising dialogue boxes, static controls, drop-down-menus, list boxes, pop-up menus, as edit controls, combo boxes, radio buttons, check boxes, push buttons, and graphic boxes. In addition, utilities to facilitate the presentation such as vertical and/or horizontal scroll bars for navigation and toolbar buttons to determine whether a region will be viewable can be employed. For example, the user can interact with one or more of the components coupled to and/or incorporated into the processor component 502.

The user can also interact with the regions to select and provide information via various devices such as a mouse, a roller ball, a keypad, a keyboard, a pen and/or voice activation, for example. Typically, a mechanism such as a push button or the enter key on the keyboard can be employed subsequent entering the information in order to initiate the search. However, it is to be appreciated that the claimed subject matter is not so limited. For example, merely highlighting a check box can initiate information conveyance. In another example, a command line interface can be employed. For example, the command line interface can prompt (e.g., via a text message on a display and an audio tone) the user for information via providing a text message. The user can than provide suitable information, such as alpha-numeric input corresponding to an option provided in the interface prompt or an answer to a question posed in the prompt. It is to be appreciated that the command line interface can be employed in connection with a GUI and/or API. In addition, the command line interface can be employed in connection with hardware (e.g., video cards) and/or displays (e.g., black and white, and EGA) with limited graphic support, and/or low bandwidth communication channels.

In accordance with one embodiment of the disclosed subject matter, the memory component 102, including the memory array 104, the program component 108, and/or other components, can be situated or implemented on a single integrated-circuit chip. In accordance with another embodiment, the memory component 102, including the memory array 104, the refresh component 110, and/or other components, can be implemented on an application-specific integrated-circuit (ASIC) chip. In yet another embodiment, the memory component 102 including the memory array 104, the program component 108, and/or other components, can be situated or implemented on multiple dies or chips.

The aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Figure 6:
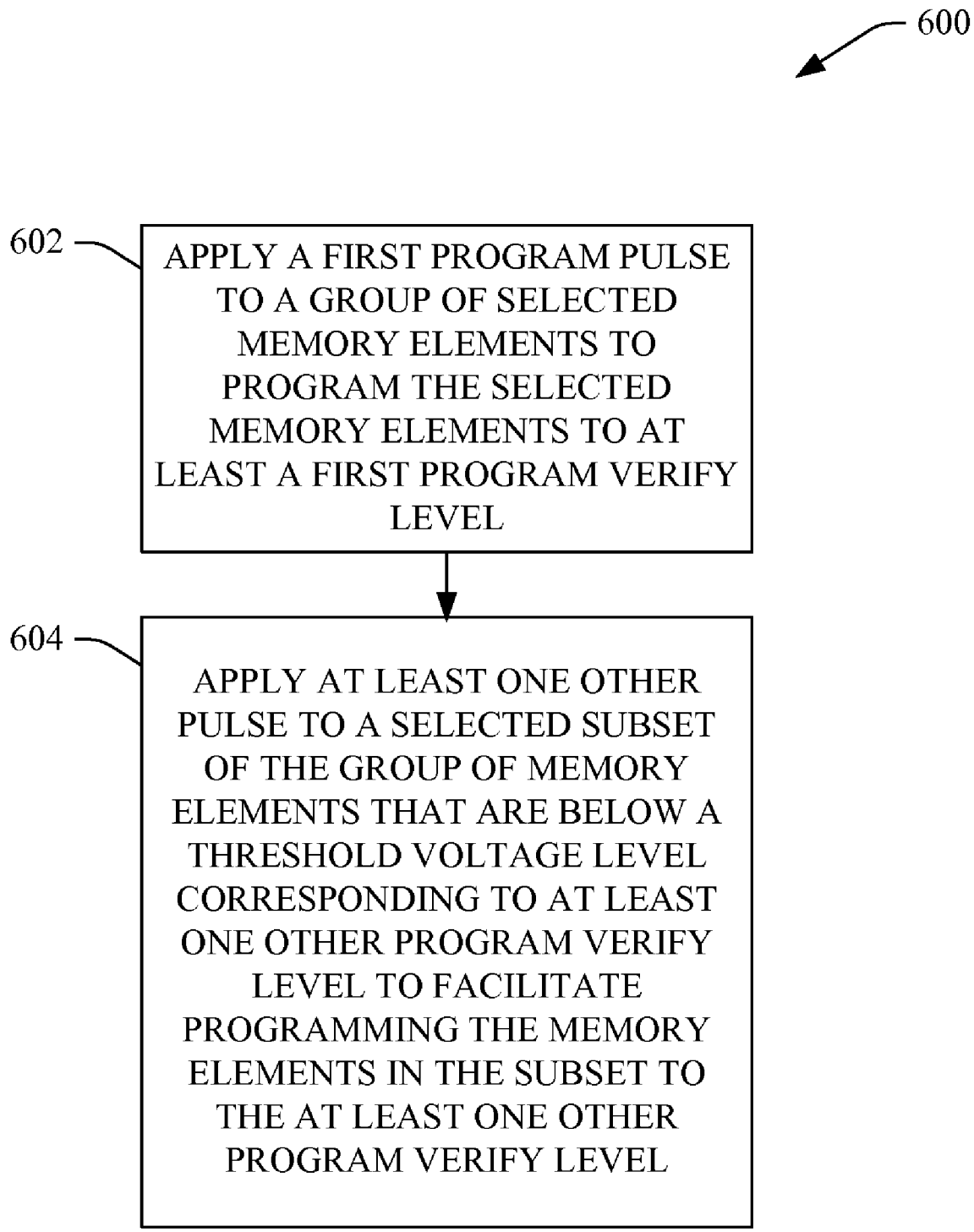
FIG. 6 illustrates a methodology that can employ moving program verify levels to facilitate programming data to memory elements in a memory in accordance with an aspect of the disclosed subject matter.
Figure 7:
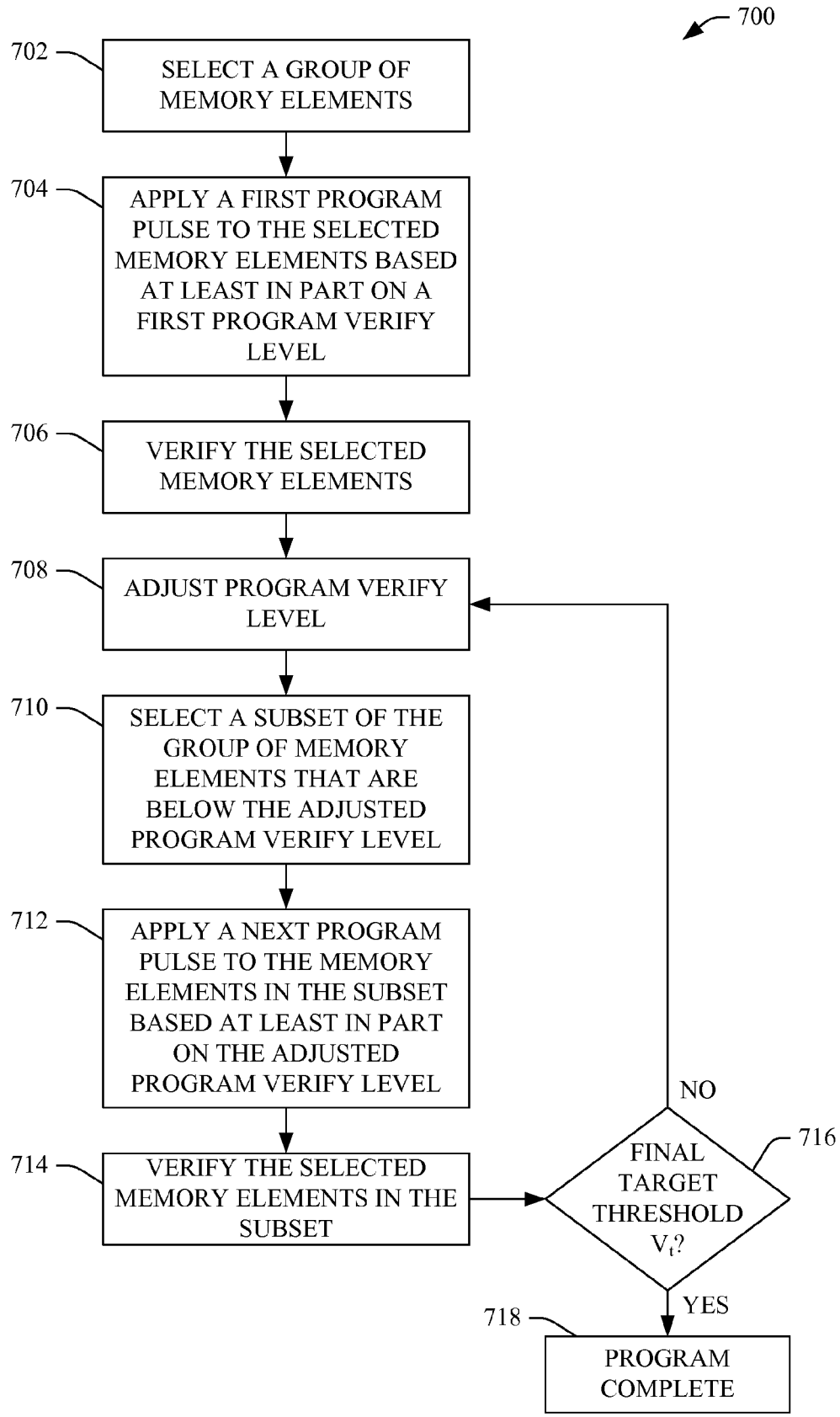
FIG. 7 depicts another methodology that can employ moving program verify levels to facilitate programming data to memory elements in a memory in accordance with an aspect of the disclosed subject matter.
Figure 8:
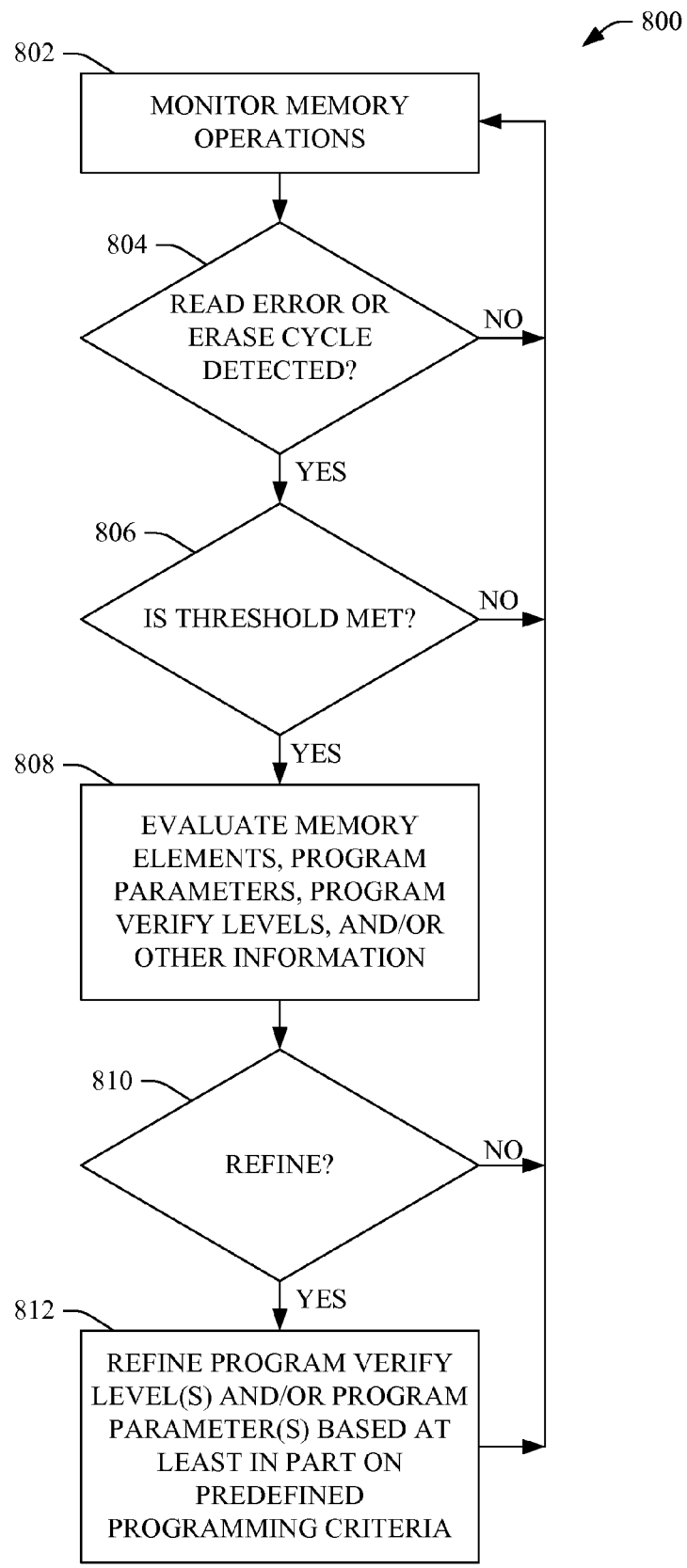
FIG. 8 illustrates a methodology that can facilitate refining moving reference programming to facilitate programming data to a memory in accordance with an embodiment of the disclosed subject matter.

FIGS. 6-8 illustrate methodologies and/or flow diagrams in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Referring to FIG. 6, a methodology 600 that can employ moving program verify levels to facilitate programming data to memory elements in a memory in accordance with an aspect of the disclosed subject matter is illustrated. At 602, a first program pulse can be applied to a group of selected memory elements to program the selected memory elements to at least a first program verify level. In an aspect, a group of memory elements 106 can be selected to facilitate programming a word of data, page of data, or a desired number of bits or elements of data to the selected memory elements 106. A first program pulse can be applied to the group of selected memory elements 106 to facilitate increasing the charge level in those cells 106 to the first program verify level. The first program verify level can be one of a specified number of program verify levels that can be employed to facilitate programming the selected memory elements 106 to a target program verify level. The first program pulse can be based at least in part on program parameters, such as a drain voltage and gate voltage that can be applied to the respective drains and gates of the selected memory elements 106, and the pulse width for the first program pulse.

At 604, at least one other program pulse can be applied to a subset of the group of selected memory elements that are below at least one other program verify level to facilitate programming the selected memory elements to the at least one other program verify level to facilitate programming the selected memory elements to a target program verify level. In one aspect, one or more program pulses can be applied to respective subsets of the group of memory elements 106 to facilitate increasing the charge levels of the selected memory elements 106 to one or more program verify levels, where the selected memory elements 106 can be programmed to the target program verify level to program the selected memory elements 106 to the desired data state, which can correspond to the target program verify level. For instance, the program verify level can be adjusted from the first program verify level to a second program verify level, which can be a higher threshold voltage level than the first program verify level. A second program pulse can be applied to a subset of the group of memory elements 106 that have a respective charge level that is below the second program verify level, while the portion of the group of memory elements 106 that are at or above the second program verify level do not receive the second program pulse.

Methodology 600 can continue to proceed to adjust the program verify levels after each program pulse up through a predetermined number of program verify levels associated with the desired data state to reach the target program verify level, where at least a portion of the group of memory elements 106 can be pulsed until the group of memory elements 106 have respective charge levels that are at or above the target program verify level. At this point, methodology 600 can end.

Turning to FIG. 7, illustrated is another methodology 700 that can employ moving program verify levels to facilitate programming data to memory elements in a memory in accordance with an aspect of the disclosed subject matter. At 702, a group of memory elements can be selected. In one aspect, a desired group of memory elements 106 can be selected to facilitate programming the selected memory elements 106 to a desired data state. The group of memory elements 106 can be related to a word of data, page of data, or a specified number of bits or elements of data.

At 704, a first program pulse can be applied to the selected memory elements based at least in part on the first program verify level. In accordance with an aspect, a first program pulse can be applied to the group of memory elements 106 to facilitate increasing the respective charge levels of each of the memory elements 106 so that the memory elements can be verified to pass the first program verify level. The first program pulse can be generated based at least in part on a first drain voltage, first gate voltage, and first pulse width, where the first program pulse can be determined based at least in part on predefined programming criteria. The first drain voltage and first gate voltage can be applied to each element 106 in the group of memory elements 106 for the length of the first pulse width.

At 706, the selected memory elements can be verified. In an aspect, the group of memory elements 106 can be verified to determine whether each cell 106 of the group of memory elements 106 is at or above the first program verify level. Optionally, the act at reference numeral 706 can be bypassed, as desired, and methodology 700 can proceed to reference numeral 708.

At 708, the program verify level (e.g., first program verify level) can be adjusted. In one aspect, the first program verify level can be moved (e.g., adjusted) to a next program verify level (or, as desired, a next program verify level can remain at the same voltage level as the previous program verify level). For instance, a programming event related to the selected memory elements 106 can comprise a specified number of program verify levels to which the memory elements 106 are to be programmed to raise the respective charge levels to the target program verify level.

At 710, a subset of the group of memory elements can be selected, wherein the subset can comprise memory elements that are below the adjusted program verify level. In an aspect, the group of memory elements 106 can be evaluated to determine which memory elements 106 are at or above the next program verify level and which are below the next program verify level. A subset of the group of memory elements 106 that are below the next program verify level can be selected to facilitate increasing the charge level of the respective cells 106 in the subset so that the cells 106 can be verified to pass the next program verify level.

At 712, a next program pulse can be applied to a subset of the group of memory elements, wherein the next program pulse can be based at least in part on the adjusted program verify level. In an aspect, a next program pulse, which can be based at least in part on a next drain voltage level, next gate voltage level and next pulse width level, can be determined based at least in part on predefined programming criteria. The next program pulse can be applied to the subset of the group of memory elements 106 to facilitate increasing the respective charge levels of those memory elements 106 so that those memory elements 106 can be verified to pass the next program verify level.

At 714, the selected memory elements (e.g., the memory elements 106 in the subset) can be verified. In one aspect, the subset of the group of memory elements 106 can be verified to determine whether each cell 106 of the subset is at or above the next program verify level. Optionally, the act at reference numeral 714 can be bypassed, as desired, and methodology 700 can proceed to reference numeral 716.

At 716, a determination can be made regarding whether the final target threshold voltage level (e.g., target program verify level) has been reached. If it is determined that the final target threshold voltage level has been reached, at 718, the programming of the group of memory elements 106 can be complete.

If, at 716, it is determined that the final target threshold level is not reached, methodology 700 can return to reference numeral 708, where the methodology 700 can proceed, where, for example, the program verify level can be adjusted to a next program verify level. The methodology 700 can proceed until each memory element 106 of the group of memory elements 106 has been programmed to a charge level that is at or above the target program verify level, which can correspond to the desired data state. At this point, methodology 700 can end.

Turning to FIG. 8, illustrated is a methodology 800 that can facilitate refining moving reference programming to facilitate programming data to a memory in accordance with an embodiment of the disclosed subject matter. At 802, operations associated with a memory (e.g., memory component 102) can be monitored. For instance, an optimizer component 312 can monitor operations, such as read operations, erase operations, programming operations, etc., associated with the memory component 102 to facilitate detecting read errors and/or erase cycles associated with the memory component 102, for example.

At 804, a determination can be made regarding whether a read error or erase cycle is detected. In one aspect, the optimizer component 312 can receive information related to read errors or erase cycles associated with the memory component 102. If it is determined that no read error or erase cycle is detected, methodology 800 can return to reference numeral 802, where operations associated with the memory can continue to be monitored.

If, at 804, it is determined that a read error or erase cycle is detected, at 806, a determination can be made as to whether a predetermined threshold number of read errors or a predetermined threshold number of erase cycles is met. In an aspect, the optimizer component 312 can track and maintain respective counts related to overall number of read errors for all memory elements 106, respective number of read errors for each memory cell 106, overall number or erase cycles for all memory elements 106, and/or respective number of erase cycles for each memory cell 106, associated with the memory component 102. For instance, when the optimizer component 312 received information indicating that a read error or erase cycle is detected, the optimizer component 312 can increment a read error count, if a read error is detected, or an erase cycle count, if an erase cycle is detected. Based at least in part on predefined programming criteria, a predetermined threshold level can be set for the total number of read errors for all memory elements 106, the total number of read errors for a particular memory element 106, the total number or erase cycles for all memory elements 106, and/or the total number of erase cycles for a particular memory element 106, associated with the memory component 102, as desired.

If, at 806, it is determined that the predetermined threshold number of read errors or erase cycles is not met, methodology 800 can return to reference numeral 802 where operations associated with the memory can continue to be monitored. If, at 806, it is determined that the predetermined threshold number of read errors or erase cycles is met, at 808, the memory elements 106, program parameters (e.g., drain voltage, gate voltage, pulse width), program verify levels, and/or other programming-related information can be evaluated. In an aspect, the optimizer component 312 can evaluate the memory elements 106, program parameters, program verify levels, and/or other information to determine whether a program verify level(s) and/or program parameter(s) related to the moving program verify level programming process is to be refined (e.g. fine tuned).

At 810, a determination can be made regarding whether a program verify level(s) or a parameter(s) is to be refined based at least in part on predefined programming criteria. If it is determined that no refining is required, methodology 800 can return to reference numeral 802 where operations associated with the memory can continue to be monitored. If, at 810, it is determined that a program verify level(s) and/or a program parameter(s) is to be modified and/or refined, at 812, the program verify level(s) and/or program parameter(s) can be refined, as desired, based at least in part on the predefined programming criteria. At this point, methodology 800 can return to reference numeral 802 where operations associated with the memory can continue to be monitored. At this point, methodology 800 can end.

Figure 9:
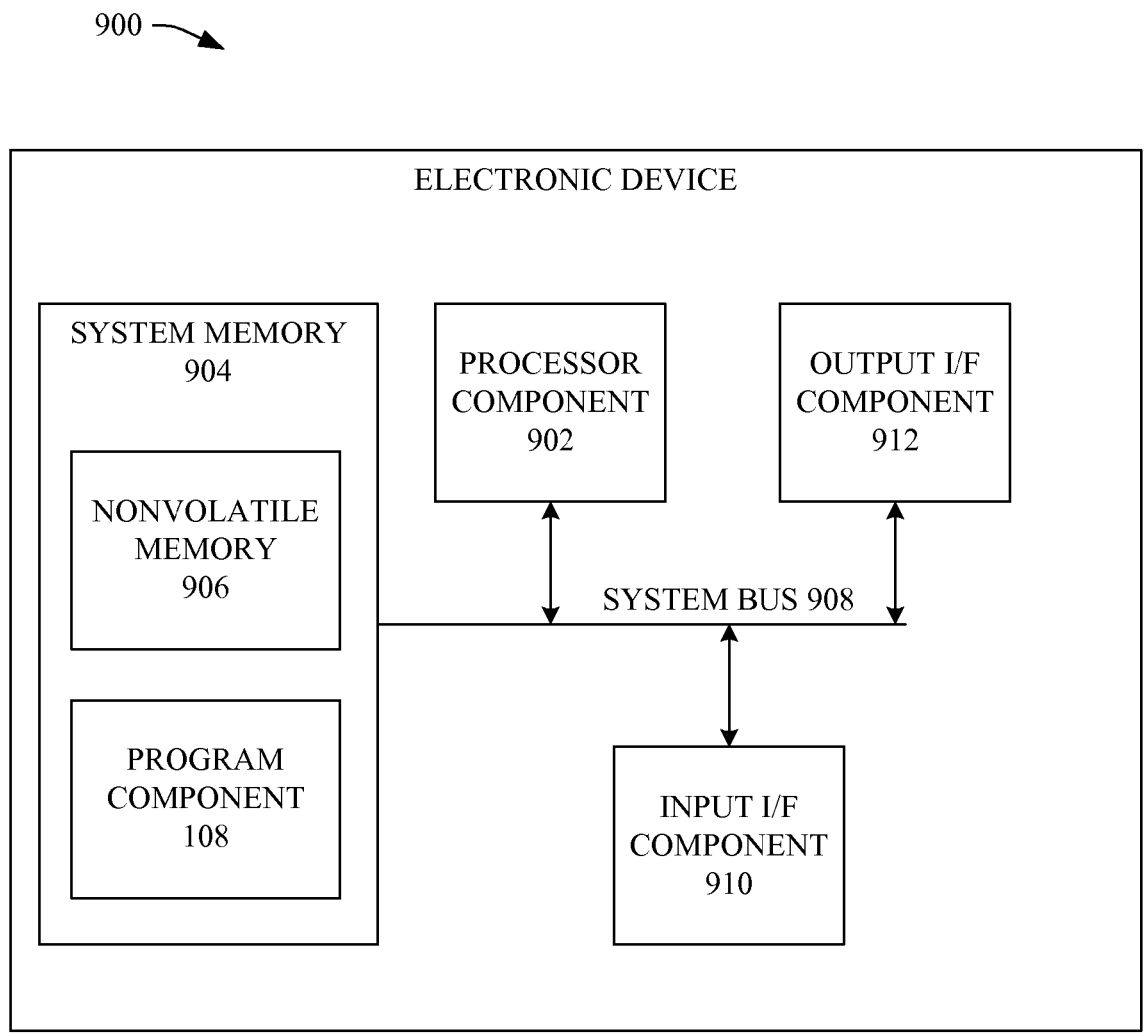
FIG. 9 is a block diagram of an exemplary, non-limiting electronic device that can employ a memory.

Referring to FIG. 9, illustrated is a block diagram of an exemplary, non-limiting electronic device 900 that can comprise and/or incorporate system 100, system 300, memory device 400, and/or system 500, or a respective portion(s) thereof, and/or implement methodology 600, methodology 700, and/or methodology 800, or respective portions thereof. The electronic device 900 can include, but is not limited to, a computer, a laptop computer, network equipment (e.g., routers, access points), a media player and/or recorder (e.g., audio player and/or recorder, video player and/or recorder), a television, a smart card, a phone, a cellular phone, a smart phone, an electronic organizer, a PDA, a portable email reader, a digital camera, an electronic game (e.g. video game), an electronic device associated with digital rights management, a Personal Computer Memory Card International Association (PCMCIA) card, a trusted platform module (TPM), a Hardware Security Module (HSM), a set-top box, a digital video recorder, a gaming console, a navigation system or device (e.g., global position satellite (GPS) system), a secure memory device with computational capabilities, a device with a tamper-resistant chip(s), an electronic device associated with an industrial control system, an embedded computer in a machine (e.g., an airplane, a copier, a motor vehicle, a microwave oven), and the like.

Components of the electronic device 900 can include, but are not limited to, a processor component 902 (e.g., which can be and/or can include the same or similar functionality as processor component 502, as depicted in FIG. 5 and described herein), a system memory 904, which can contain a nonvolatile memory 906, and a system bus 908 that can couple various system components including the system memory 904 to the processor component 902. In one aspect, the system memory 904 can be and/or can comprise the same or similar functionality as respective components (e.g., memory component 102, including the program component 108) as more fully described herein, for example, with regard to system 100, system 300, memory device 400, system 500, etc. For instance, the system memory 904 can include a program component 108.

In another aspect, the system bus 908 can be comprised of any of several types of bus structure(s) including, but not limited to, a memory bus, memory controller, peripheral bus, external bus, and/or a local bus using any variety of available bus architectures including, but not limited to, Open NAND Flash Interface, Compact Flash Interface, Multimedia Card (MMC), Secure Digital (SD), CE-ATA, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

Electronic device 900 can typically include a variety of computer readable media. Computer readable media can be any available media that can be accessed by the electronic device 900. By way of example, and not limitation, computer readable media can comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, nonvolatile memory 906 (e.g., flash memory), or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by electronic device 900. Communication media typically embodies computer readable instructions, data structures, program modules or other data in a modulated data signal such as a carrier wave or other transport mechanism and includes any information delivery media.

The system memory 904 can include computer storage media in the form of volatile (e.g., SRAM) and/or nonvolatile memory 906 (e.g., flash memory), where the nonvolatile memory 906 can be removable media or non-removable media. A basic input/output system (BIOS), containing the basic routines that can facilitate transferring information between elements within electronic device 900, such as during start-up, can be stored in the system memory 904. The system memory 904 typically also can contain data and/or program modules that can be accessible to and/or presently be operated on by the processor component 902. By way of example, and not limitation, the system memory 904 can also include an operating system(s), application programs, other program modules, and program data.

The nonvolatile memory 906 can be removable or non-removable. For example, the nonvolatile memory 906 can be in the form of a removable memory card or a USB flash drive. In accordance with one aspect, the nonvolatile memory 906 can include flash memory (e.g., single-bit flash memory, multi-bit flash memory), ROM, PROM, EPROM, EEPROM, or NVRAM (e.g., FeRAM), or a combination thereof, for example. Further, a flash memory can comprise NOR flash memory and/or NAND flash memory.

A user can enter commands and information into the electronic device 1000 through input devices (not shown) such as a keypad, microphone, tablet, or touch screen although other input devices can also be utilized. These and other input devices can be connected to the processor component 902 through input interface component 910 that can be connected to the system bus 908. Other interface and bus structures, such as a parallel port, game port or a universal serial bus (USB) can also be utilized. A graphics subsystem (not shown) can also be connected to the system bus 908. A display device (not shown) can be also connected to the system bus 908 via an interface, such as output interface component 912, which can in turn communicate with video memory. In addition to a display, the electronic device 900 can also include other peripheral output devices such as speakers (not shown), which can be connected through output interface component 912.

It is to be understood and appreciated that the computer-implemented programs and software can be implemented within a standard computer architecture. While some aspects of the disclosure have been described above in the general context of computer-executable instructions that can be run on one or more computers, those skilled in the art will recognize that the technology also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices (e.g., PDA, phone), microprocessor-based or programmable consumer electronics, and the like, each of which can be operatively coupled to one or more associated devices.

The illustrated aspects of the disclosure may also be practiced in distributed computing environments where certain tasks are performed by remote processing devices that are linked through a communications network. In a distributed computing environment, program modules can be located in both local and remote memory storage devices.

As utilized herein, terms "component," "system," "interface," and the like, can refer to a computer-related entity, either hardware, software (e.g. in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Furthermore, the disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein can encompass a computer program accessible from any computer-readable device, carrier, or media. For example, computer readable media can include, but is not limited to, magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications can be made to this configuration without departing from the scope or spirit of the disclosed subject matter.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

What has been described above includes examples of aspects of the disclosed subject matter. It is, of course, not possible to describe every conceivable combination of components or methodologies for purposes of describing the disclosed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A system that programs data in a memory component, comprising:
   the memory component comprising a plurality of memory elements to facilitate data storage; and
   a program component that:
   employs a set of N program verify levels to facilitate progressive program pulse of a selected group of memory elements to respectively program each of the selected memory elements to a charge level that is at or above a target program verify level that corresponds to a specified data state, wherein N is an integer greater than 1 and wherein the Nth program verify level is the target program verify level, based at least in part on predefined programming criteria;
   applies a program pulse to the selected group of memory elements to program the selected group of memory elements to a first program verify level and applies at least one other program pulse to a subset of the selected group of memory elements that are below at least one other program verify level to program the subset of the selected group of memory elements to at least one other program verify level based on respective charge levels;
   sets the first program verify level, selects the group of memory elements, sets a first set of program parameters associated with a first program pulse, and applies the first program pulse to the selected group of memory elements to facilitate an increase in charge levels stored in respective memory elements in the selected group of memory elements so that all or substantially all of the selected memory elements contain a charge level that is at or above the first program verify level;
   adjusts the first program verify level to the at least one other program verify level that corresponds to a higher charge level than or equal to the first program verify level, evaluates the group of memory elements to identify and select memory elements that have a respective charge level below the at least one other program verify level to define the subset of the group of memory elements that have a charge level that is below the at least one other program verify level, sets at least one other set of program parameters associated with the at least one other program pulse, and applies the at least one other program pulse to the selected subset of the group of memory elements to facilitate an increase in charge levels stored in respective memory elements in the selected subset of the group of memory elements so that all or substantially all of the selected memory elements contain a charge level that is at or above the at least one other program verify level; and
   evaluates the group of memory elements to identify and select memory elements of the group of memory elements to a second subset that have a respective charge level that is at or above the at least one other program verify level after applying the first program pulse to facilitate an increase in charge levels in the group at or above the first program verify level and before applying the at least one other program pulse to facilitate an increase in charge levels of the selected subset of the group at or above the at least one other program verify level.

2. The system of claim 1, the predefined programming criteria relates to at least one of programming speed, density of the memory component, type of memory, or number of program verify levels.

3. The system of claim 1, the program component does not apply the at least one other program pulse to the second subset that includes a subgroup of memory elements from the group of memory elements.

4. The system of claim 1, after each program pulse, the program component adjusts a current program verify level to a next program verify level, which corresponds to a higher charge level than or equal to a charge level associated with the current program verify level, until the current program verify level is the target program verify level.

5. The system of claim 4, after the program pulse is applied to the selected group of memory elements to increase respective charge levels of the selected memory elements to at or above the target program verify level, the program component applies one or more additional program pulses to the subset of memory elements if the memory elements in the subset have respective charge levels that are below the target program verify level.

6. The system of claim 1, the program component applies a respective program pulse after each adjustment of program verify level to a next program verify level, wherein each program pulse has a respective voltage level that is based at least in part on a drain voltage and gate voltage that are respectively applied to drains and gates of selected memory elements, and each program pulse has a respective pulse width.

7. The system of claim 1, further comprising:
   an optimizer component that evaluates at least one of memory elements in the memory component, program parameters, program verify levels, or programming-related information, when specified conditions are met, to facilitate refining at least one of a program verify level or a program parameter to facilitate improved programming of data into the memory elements.

8. The system of claim 7, the optimizer component tracks and maintains a count of at least one of a number of read errors for all memory elements, or a respective number of read errors for each memory element, in the memory component.

9. The system of claim 8, the specified conditions are met when at least one of a predetermined number of erase cycles for all memory elements is reached, a predetermined number of erase cycles for a particular memory element is reached, a predetermined number of read errors for all memory elements is reached, a predetermined number of read errors for a particular memory element is reached, or the optimizer component receives input that indicates that the optimizer component is to refine at least one of a program verify level or a program parameter.

10. The system of claim 1, the memory component comprising at least one of floating gate memory elements or multi-element memory cells.

11. An electronic device comprising the system of claim 1.

12. The electronic device of claim 11, the electronic device is one of a computer, a cellular phone, a digital phone, a video device, a smart card, a personal digital assistant, a television, an electronic game, a digital camera, an electronic organizer, an audio player, an audio recorder, an electronic device associated with digital rights management, a Personal Computer Memory Card International Association (PCMCIA) card, a trusted platform module (TPM), an electronic control unit associated with a motor vehicle, a global positioning satellite (GPS) device, an electronic device associated with an airplane, an electronic device associated with an industrial control system, a Hardware Security Module (HSM), a set-top box, a secure memory device with computational capabilities, or an electronic device with at least one tamper-resistant chip.

13. A method that facilitates programming data in a memory, comprising:
applying a first program pulse to a selected group of memory elements associated with the memory to program the group of memory elements to at least a first program verify level;
applying at least one other program pulse to a selected subset of the group of memory elements that are below at least one other program verify level to facilitate programming the subset of the group of memory elements to at least one other program verify level to facilitate programming the group of memory elements to a final program verify level that corresponds to a specified data state;
selecting a group of memory elements;
applying the first program pulse to the group of memory elements to facilitate increasing the respective charge levels of the memory elements in the group to the first program verify level, the first program pulse is based at least in part on a first drain voltage level, a first gate voltage level, and a first pulse width; and
evaluating the group of memory elements to identify and select memory elements of the group of memory elements to a second subset that have a respective charge level that is at or above at least one other program verify level that is higher than the first program level after applying the first program pulse to facilitate an increase in charge levels in the group at or above the first program verify level and before applying the at least one other program pulse to facilitate an increase in charge levels of the selected subset of the group at or above the at least one other program verify level.

14. The method of claim 13, further comprising:
adjusting a current program verify level to at least one other program verify level unless the current program verify level is the final program verify level;
evaluating the group of memory elements to facilitate determining which memory elements are below the at least one other program verify level;
selecting a subset of the group of memory elements, wherein each memory element in the subset has a respective charge level that is below the at least one other program verify level;
not applying the at least one other program pulse to the second subset that includes a subgroup of memory elements from the group of memory elements; and
applying the at least one other program pulse to the subset of the group of memory elements to facilitate increasing the respective charge levels of the memory elements in the subset to at least the one other program verify level to facilitate increasing respective charge levels of the group of memory elements to at least the final program verify level, wherein the at least one other program pulse is based at least in part on at least one other drain voltage level, at least one other gate voltage level, and at least one other pulse width.

15. The method of claim 13, further comprising:
determining whether a current program verify level is the final program verify level;
determining whether all memory elements in the group of memory elements have respective charge levels that are at or above the final program verify level, if the current program verify level is the final program verify level; and
applying at least one additional program pulse to any memory element that has a charge level that is below the final program verify level until all memory elements in the group have a charge level that is at or above the final program verify level.

16. The method of claim 13, further comprising:
monitoring operations associated with the memory;
detecting a read error associated with one or more memory elements in the memory;
incrementing a read error count based at least in part on the detected read error; and
determining whether a predetermined threshold number of read errors is met.

17. The method of claim 16, further comprising:
if the predetermined number of read errors is met,
evaluating at least one of memory elements, program parameters, program verify levels, or other programming-related information, associated with the memory, wherein the program parameters comprising at least one of a drain voltage, a gate voltage, or a pulse width associated with a program pulse; and
refining at least one or a program verify level or a program parameter, based at least in part on predefined programming criteria.

* * * * *